United States Patent [19]

Heller et al.

[11] Patent Number: 5,653,587

[45] Date of Patent: Aug. 5, 1997

[54] METHOD FOR TRANSPORTING AN ARTICLE THROUGH PROCESS HOUSING WHILE MINIMIZING A LOSS OF A CONTROLLED ATMOSPHERE THEREFROM

[75] Inventors: David Heller, Basking Ridge; James Neville, Springfield, both of N.J.

[73] Assignee: Heller Industries, Florham Park, N.J.

[21] Appl. No.: 573,667

[22] Filed: Dec. 18, 1995

[51] Int. Cl.$^6$ .................................. F27B 9/00; F27B 3/00
[52] U.S. Cl. .................. 432/121; 432/128; 198/607; 198/803.01; 198/465.1
[58] Field of Search ............... 198/465.1, 468.6, 198/803.01, 607; 414/172, 196, 211; 432/121, 128

[56] References Cited

U.S. PATENT DOCUMENTS

| | | | |
|---|---|---|---|
| 4,689,008 | 8/1987 | Hailey | 432/121 |
| 4,712,670 | 12/1987 | Burkhardt | 198/803.01 |
| 5,351,801 | 10/1994 | Markin et al. | 198/465.1 |

FOREIGN PATENT DOCUMENTS

562156-A1  9/1993  European Pat. Off. ............ 198/607

Primary Examiner—Henry A. Bennett
Assistant Examiner—Jiping Lu
Attorney, Agent, or Firm—Patrick J. Pinto

[57] ABSTRACT

A method of transporting an article through a processing housing while minimizing the loss of a controlled atmosphere from the process housing. This method includes the steps of placing an article on a first carriage member, then vertically displacing the article from the entry level through an entry opening of entry housing to a processing level. The article is then transferred from the first carriage member to an endless conveyor for transporting, horizontally, through the process housing. The article is then transferred to a second carriage member which moves the article vertically through a exit housing to and through an exit opening near an exit level. The processed article is then removed at the exit level. The vertical distance between the process level and the entry opening and the exit opening separates the controlled atmosphere from the ambient atmosphere exterior of the housings.

11 Claims, 1 Drawing Sheet

METHOD FOR TRANSPORTING AN ARTICLE THROUGH PROCESS HOUSING WHILE MINIMIZING A LOSS OF A CONTROLLED ATMOSPHERE THEREFROM

BACKGROUND OF THE INVENTION

1. Field of the Invention

This invention generally relates to an improved method for soldering electronic components to printed circuit boards for producing electronic subassemblies. This method is more particularly related to a method of reducing the loss of a cover gas from the process chamber.

2. Description of Related Art

The art of soldering electronic components to printed circuit boards is well known. It is also well known that exposing the electronic subassemblies to an inert cover gas during the soldering operation will result in a more reliable product.

It has been recognized that minimizing the loss of the cover gas would make the soldering operation more efficient. Some of the known commercially available equipment have employed selectively operated doors; strips of material, that act as a curtain; air curtains; and the like to minimize the loss of the cover gas. It has been determined that there is a need for a more efficient method for conserving a cover gas, that is used in a soldering operation. This needed method preferably would not require the use of mechanical doors, curtains or the like. This improved method must also be energy efficient while maintaining a predetermined level of the cover gas.

It has been found that the present invention solves the identified need.

SUMMARY OF THE INVENTION

The invention may be briefly summarized with respect to its objects. It is an object of this invention to provide and it does provide a method of transporting an article through a controlled atmosphere of a process housing while simultaneously minimizing a loss of the controlled atmosphere from the process housing.

The one embodiment of the method of the present invention, for use in soldering of the components of an electronic sub assembly, includes the steps of:

a) placing an article to be soldered on a first carriage member at an entry level of an entry housing;

b) moving the article a predetermined vertical distance through an entry opening, that is located at one end of the entry housing near the entry level, to a soldering level of the entry housing, the entry housing also having a first opening in one of its walls, said first opening being located at the soldering level, the wall of the entry housing, with the first opening therein, abutting and communicating with a first end of a solder housing in a fluid tight relationship, c) transferring the article from the first carriage member to a conveyor of a solder housing by way of the first opening;

d) conveying the article horizontally from the first end to a second end of the solder housing, while simultaneously exposing the article to the controlled atmosphere therein;

e) positioning a second carriage member at a soldering level of an exit housing, the exit housing having a through aperture formed in one of its walls, said through aperture being located at the soldering level; the wall of the exit housing, having the through aperture therein, abutting and communicating with the second end of the solder housing in a fluid tight relationship;

transferring the article at the second end of the solder housing from the conveyor to the second carriage member, through the through aperture;

moving the second carriage member, with the article thereon, a predetermined vertical displacement from said soldering level through an exit opening at one end of the exit housing to an exit level, the exit opening of the exit housing being near the exit level;

removing the article from the second carriage member at the exit level;

minimizing the loss of the controlled atmosphere from the solder housing through the entry opening of the entry housing by providing the predetermined vertical distance between the soldering level and the entry level; and minimizing the loss of the controlled atmosphere from the solder housing through the exit opening of the exit housing by providing the predetermined vertical displacement between the soldering level and the exit level.

The improved method is adapted for use when the controlled atmosphere of the process housing is operated at a temperature, that is above or below the ambient temperature at the entry or exit level. This method may also be applied to methods for curing compounds in a controlled atmosphere.

In addition to the above summary, the following disclosure is intended to be detailed to insure adequacy and aid in the understanding of the invention. However, this disclosure, showing particular embodiments of the invention, is not intended to describe each new inventive concept that may arise. These specific embodiments have been chosen to show at least one preferred or best mode for a method of the present invention. These specific embodiments, as shown in the accompanying drawings, may also include diagrammatic symbols for the purpose of illustration and understanding.

Figures 1, 2:
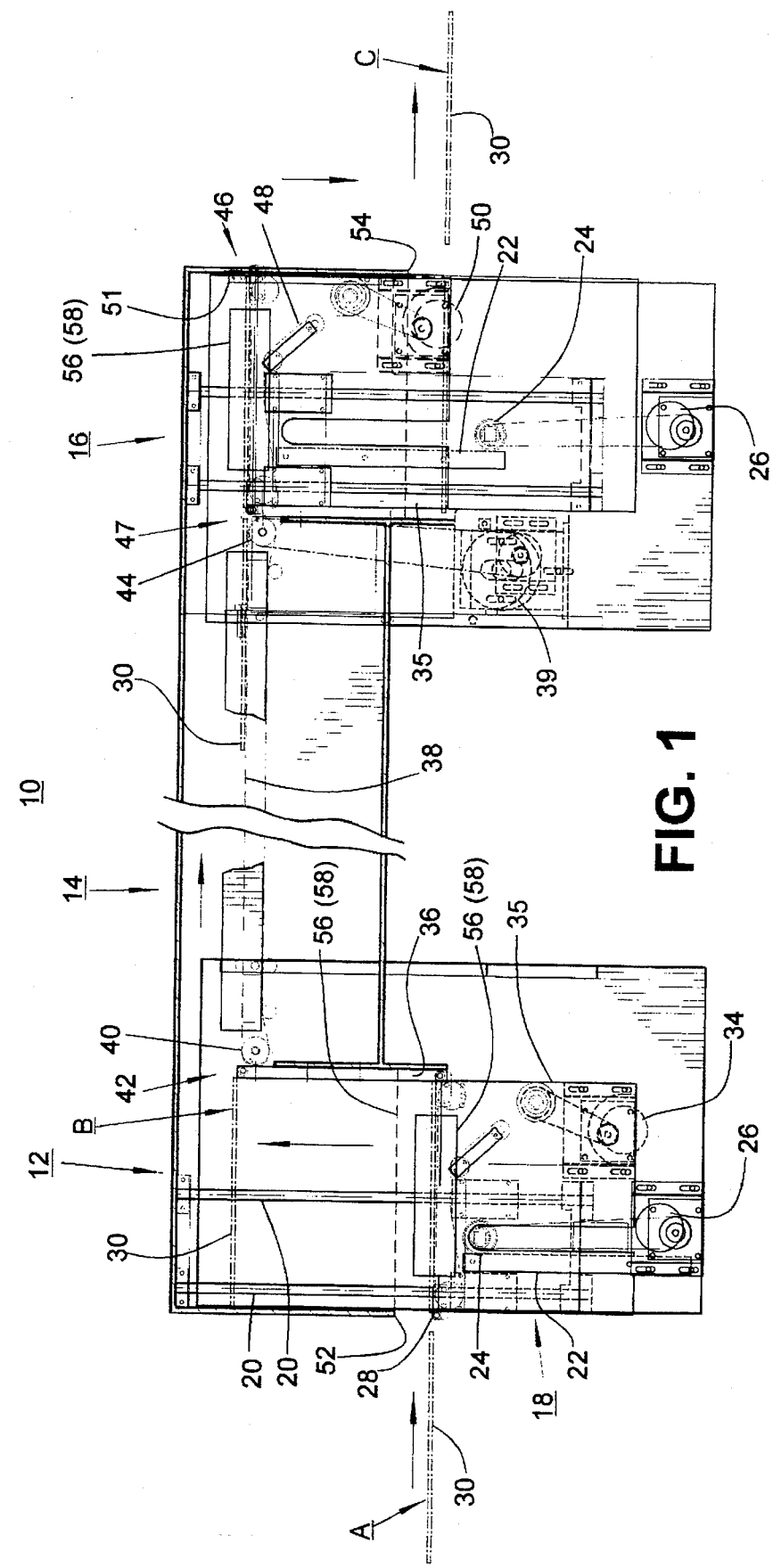
FIG. 1 represents a front elevation of an apparatus that may be used for transporting an article, this view showing a first carriage member at an entry level, and a second carriage member at a processing level.
FIG. 2 represents a fragmentary sectional view of a typical apparatus for supporting and transporting the article.

In the following description and in the appended claims, various details are identified by specific names for convenience. These names are intended to be generic in their application while differentiating between the various details. The corresponding reference numbers refer to like members throughout the several figures of the drawing.

The drawings accompanying and forming a part of this specification disclose details of construction for the sole purpose of explanation. It is to be understood that structural details may be modified without departing from the concept and principles of the invention as claimed. This invention may also be incorporated into other structural forms than shown.

DETAILED DESCRIPTION OF THE INVENTION

Referring to FIGS. 1 and 2, one type of apparatus is shown, that employs the method of the present invention. A soldering apparatus is generally identified as 10. This soldering apparatus 10 includes an entry housing 12, a processing housing 14, and an exit housing 16. It is preferred that the entry housing 12, the processing housing 14 and the exit housing 16 be connected and in a substantially fluid tight relationship. This fluid tight relationship minimizes the loss of a controlled atmosphere from the processing housing 14. Production soldering of electronic components to a printed circuit board generally is done in a fluid tight housing containing an inert cover gas, such as Nitrogen. It is therefore important to minimize the loss of the cover gas into the atmosphere for the economical use of the cover gas. The heating of the cover gas to a predetermined temperature, for fusing the components, will also aid in the stratification of the cover gas from a gas at the entry level.

The processing housing 14 used in a typical soldering application may be of a reflow type, a wave type and the like. The cover gas, that is used in the soldering operation, is generally metered into the process housing 14 by a pressure regulator, that is not shown, but of a standard design. The pressure regulator maintains the cover gas in the processing housing 14 at a positive pressure with respect to the ambient atmosphere that is exterior to the apparatus 10.

The entry housing 12 includes a first carriage member 18. This first carriage member 18 is reciprocally mounted for travel into the entry housing 12. This reciprocal mounting allows the first carriage member 18 to be selectively moved in a vertical direction, as shown by the arrow, from an entry level A to a soldering level B. It is preferred that the first carriage member 18 be linearly guided by a plurality of vertical rods or shafts 20. The reciprocal movement is provided by a rack 22 and pinion 24 arrangement. This rack 22 and pinion 24 arrangement is selectively driven by a motor 26 by way of a chain and sprocket arrangement. Alternatively, the first carriage member 18 may be vertically displaced by means of a linear actuator, that is electrically or pneumatically operated.

It is preferred that the first carriage member 18 include a pair of endless roller chains 28. These endless roller chains 28 are of the extended pin type and are arrayed in opposed relationship, as may be seen in FIG. 2. An article 30, such as printed circuit board, electronic subassembly or the like, is supported by the extended pins 32 that are spaced at selected intervals along the length of each of the roller chains 28. The roller chains 28 are driven by a second motor 34 by way of a second sprocket and chain arrangement. This second motor 34 is mounted on a side plate 35 of the first carriage member 18. The selectively driven endless roller chains 28 move the article 30 toward at least one elongated stop 36. The movement of the roller chains 28 should be sufficient to bring a front edge of the article into an abutted condition with the elongated stop 36.

The endless roller chains 28 are preferably brought to a stopped condition during the vertical movement of the first carriage member 18. After the first carriage member 18 is moved to the soldering or processing level B, the endless roller chains 28 are selectively driven for transferring the article 30 from the first carriage member 18 to an endless conveyor 38. The endless conveyor 38 is selectively driven by its motor 39. The article 30 is transferred onto a first end 40 of the endless conveyor 38. This transfer of the article from the entry housing 12 to the processing housing 14 is made through a first opening 42 of the entry housing 12. As previously noted the connection between the entry housing 12 and the processing housing 14 must be fluid tight.

The length of the process housing 14 is dependent on the type of operation that is being performed on the article 30. The second end 44 of the endless conveyor 38, that is distal the first end 40, is located at the exit end of the process or solder housing 14. The endless conveyor 38 is made of a pair of opposed endless roller chains, similar to the arrangement that is depicted in FIG. 2. After the article 30 is conveyed to the second end 44, it is transferred to a second carriage member 46 by way of a through aperture 47. The connection between the process housing 14 and the exit housing must be fluid tight. The second carriage member 46, of course, must be positioned at the soldering or process level B in order to receive the article 30. The second carriage member 46 includes a pair of opposed endless roller chains 48. These roller chains 48 are substantially a mirror image of the roller chains 28 and have a similar mounting and guiding configuration. During the transfer of the article from the second end 44 to the second carriage member 46, the roller chains 48 are driven by its drive motor 50. After the article 30 is completely transferred and supported by the second carriage member 46, the movement of the roller chains 48 is stopped. It is preferred that an elongated stop bar 51 be positioned to stop the article 30 from further movement, in the event that the roller chains 28 overfeed.

The second carriage member 46 with the article supported thereon, is then vertically displaced a selected distance to an exit level C. The roller chains 48 are then driven to deliver the article 30 from the exit housing 16. The exit housing 16, and the mounting and operation of the second carriage member 46 is substantially a mirror image of the entry housing 12. The vertical displacement of the second carriage member 46 is independently controlled by its own motor 26. However the linear displacement may be provided by other means, that have been previously discussed in connection with the first carriage member 18.

The apparatus shown in the drawing is typical for utilizing the method of the present invention for an apparatus wherein the controlled atmosphere is lighter than the atmosphere exterior of the apparatus 10. For comparison purposes a convention soldering system having open ends uses approximately 1200 SCFH of a cover gas. A soldering system using entry and exit restricting means, such as strips of fabric, uses approximately 850 SCFH of a cover gas. A soldering system using the method of the present invention, and having a vertical displacement of between 22 cm. and 30 cm. has reduced the consumption of a cover gas, such as nitrogen, to the vicinity of 350 SCFH. That vertical displacement is measured between the processing level and the entry opening 52 and/or the exit opening 54. The cover gas usage can be decreased further by increasing the vertical displacement.

If the controlled atmosphere is heavier that the ambient atmosphere, then the processing level would be placed below the entry and exit levels.

It is to be noted, that the present invention may be used in an on demand system, meaning that the flow of the article 30 through the housings may be controlled by sensors, gates, limit switches, and the like.

Referring in particular to FIG. 2, the guides 56 and 58 may have a fixed distance therebetween or may be adjustable for accommodating various widths of articles 30.

Directional terms such as "front", "back", "in", "out", downward, upper, lower and the like may have been used in the description. These terms are applicable to the embodiments shown and described in conjunction with the drawings. These terms are merely used for the purpose of description in connection with the drawings and do not necessarily apply to the position in which the present invention may be used.

While these particular embodiments of the present invention have been shown and described, it is to be understood that the invention is not limited thereto and protection is sought to the broadest extent that the prior art allows.

What is claimed is:

1. A method of transporting an article to be processed through a process housing while minimizing a loss of a controlled atmosphere from the process housing, comprising the steps of:

a) placing an article to be processed on a first carriage member at an entry level of an entry housing;

b) moving the article a predetermined vertical distance through an entry opening, that is located at one end of the entry housing near the entry level, to a processing level of the entry housing, the entry housing also having a first opening in one of its walls, said first opening being located at the processing level so that a first edge is positioned intermediate the entry opening and the processing level, the wall of the entry housing, with the first opening therein, abutting and communicating with a first end of a process housing in a first fluid tight relationship, said first fluid tight relationship being arrayed for minimizing contamination of the controlled atmosphere interior of the process housing with an ambient atmosphere exterior of the process housing by way of a first joint between the wall of the entry housing and the first end of the process housing;

c) transferring the article from the carriage member to a conveyor of the process housing by way of the first opening;

d) conveying the article horizontally from the first end to a second end of the process housing, while simultaneously exposing the article to the controlled atmosphere therein;

e) positioning a second carriage member at a processing level of the exit housing, the exit housing having a through aperture formed in one of its walls, said through aperture being located at the processing level so that a first side is positioned intermediate an exit opening and the processing level; the wall of the exit housing, having the through aperture therein, abutting and communicating with the second end of the process housing in a second fluid tight relationship; said second fluid tight relationship being arrayed for minimizing contamination of the controlled atmosphere interior of the process housing with the ambient atmosphere exterior of the process housing by way of a second joint between the wall of the exit housing and the second end of the process housing;

transferring the article at the second end of the process housing from the conveyor to the second carriage member, through the through aperture;

moving the second carriage member with the article thereon a predetermined vertical displacement from said processing level through the exit opening at one end of the exit housing to an exit level, the exit opening of the exit housing being near the exit level;

removing the article from the second carriage member at the exit level;

minimizing the contamination of the controlled atmosphere in the process housing through the first opening by positioning the first edge near the processing level while simultaneously minimizing the loss of the controlled atmosphere from the process housing through the entry opening of the entry housing by providing the predetermined vertical distance between the processing level and the entry level; and minimizing the contamination of the controlled atmosphere in the process housing through the through aperture by positioning the first side near the processing level while simultaneously minimizing the loss of the controlled atmosphere from the process housing through the exit opening of the exit housing by providing the predetermined vertical displacement between the processing level and the exit level.

2. The method as recited in claim 1 which includes the further step of:

a) tempering the article to a predetermined temperature by controlling the temperature of the controlled atmosphere interior of the process housing.

3. The method as recited in claim 1 which includes the further step of:

a) exposing the article to a selected gas as it is being conveyed through the controlled atmosphere of the process housing.

4. The method as recited in claim 3 which includes the further step of:

a) tempering the article to a predetermined temperature by controlling the temperature of the controlled atmosphere interior of the process housing.

5. The method as recited in claim 1 which includes the further steps of a) supporting and guiding the article on the first carriage member by a first pair of opposed endless roller chains, each of the first pair of opposed endless roller chains being of the extended pin type.

b) supporting and guiding the article being conveyed through the process housing by a second pair of opposed endless roller chains, each of the second pair of opposed endless roller chains being of the extended pin type; and c) supporting and guiding the article on the second carriage member by a third pair of opposed endless roller chains, each of the third pair of opposed endless roller chains being of the extended pin type.

6. The method as recited in claim 1 which includes the further step of:

raising the temperature of the article by heating the controlled atmosphere interior of the process housing to a predetermined temperature above the temperature at the entry level and the exit level, the processing level being located above the entry level and the exit level.

7. The method as recited in claim 3 which includes the further step of:

raising the temperature of the article by heating the controlled atmosphere interior of the process housing to a predetermined temperature above the temperature at the entry level and the exit level; the processing level being located above the entry level and the exit level.

8. The method as recited in claim 5 which includes the further step of:

raising the temperature of the article by heating the controlled atmosphere interior of the process housing to a predetermined temperature above the temperature at the entry level and the exit level; the processing level being located above the entry level and the exit level.

9. The method as recited in claim 1 which includes the further step of:

lowering the temperature of the article by cooling the controlled atmosphere interior of the process housing to a predetermined temperature below the temperature at the entry level and the exit level, the processing level being located below the entry level and the exit level.

10. The method as recited in claim 3 which includes the further step of:

lowering the temperature of the article by cooling the controlled atmosphere interior of the process housing to a predetermined temperature below the temperature at the entry level and the exit level, the processing level being located below the entry level and the exit level.

11. The method as recited in claim 5 which includes the further step of:

lowering the temperature of the article by cooling the controlled atmosphere interior of the process housing to a predetermined temperature below the temperature at the entry level and the exit level; the processing level being located below the entry level and the exit level.

* * * * *